(12) United States Patent
Garbin et al.

(10) Patent No.: US 10,680,597 B2
(45) Date of Patent: Jun. 9, 2020

(54) SWITCHING DEVICE WITH ACTIVE PORTION CONFIGURED TO SWITCH BETWEEN INSULATING STATE AND CONDUCTING STATE

(71) Applicant: IMEC vzw, Leuven (BE)

(72) Inventors: Daniele Garbin, Leuven (BE); Robin Degraeve, De Pinte (BE); Ludovic Goux, Hannut (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/414,609

(22) Filed: May 16, 2019

(65) Prior Publication Data
US 2019/0356308 A1    Nov. 21, 2019

(30) Foreign Application Priority Data

May 17, 2018 (EP) .................................... 18173009

(51) Int. Cl.
*H03K 17/0412* (2006.01)
*H01L 45/00* (2006.01)

(52) U.S. Cl.
CPC ... *H03K 17/04123* (2013.01); *H01L 45/1206* (2013.01); *H01L 45/143* (2013.01); *H01L 45/144* (2013.01); *H01L 45/16* (2013.01)

(58) Field of Classification Search
None
See application file for complete search history.

(56) References Cited

U.S. PATENT DOCUMENTS

| | | | |
|---|---|---|---|
| 6,967,344 B2 | 11/2005 | Ovshinsky et al. | |
| 2008/0006811 A1* | 1/2008 | Philipp | H01L 45/06 257/4 |
| 2008/0017841 A1 | 1/2008 | Lee et al. | |
| 2019/0221739 A1* | 7/2019 | Kim | H01L 27/224 |

OTHER PUBLICATIONS

Prokhorov, E., et al. "Dielectric Properties of Ge2Sb2Te5 Phase-Change Films." Journal of Applied Physics, vol. 113, No. 11, 2013, p. 113705., doi:10.1063/1.4795592 (Year: 2013).*
Yokota, Ryosuke, "Electronic Dielectric Constants of Crystalline and Amorphous GeSb2Te4 and Ge2Sb2Te5Semiconductors." Japanese Journal of Applied Physics, vol. 28, No. Part 1, No. 8, 1989, pp. 1407-1411., doi:10.1143/jjap.28.1407. (Year: 1989).*
Ielmini, D. et al "Analytical model for subthreshold conduction and threshold switching in chalcogenide-based memory devices," Journal of Applied Physics 102, 054517; 2007; 14 pages.
European Search Report dated Nov. 27, 2018 in Application No. 18173009.4, in 7 pages.

* cited by examiner

*Primary Examiner* — J. E. Schoenholtz
(74) *Attorney, Agent, or Firm* — Knobbe, Martens, Olson & Bear LLP

(57) ABSTRACT

The disclosed technology generally relates to a switching device and more particularly to a switching device based on an active portion capable of switching from an insulating state to a conductive state. In an aspect, a switching device comprises an active portion interposed between two electrodes and capable of switching from an insulating state to a conducting state when a voltage higher than a threshold value is applied between the two electrodes. The threshold value is lowered by a dielectric permittivity distribution which produces a concentration of electrical field at a location within the active portion. Thus, the switching device may be devoid of a third control electrode.

17 Claims, 5 Drawing Sheets

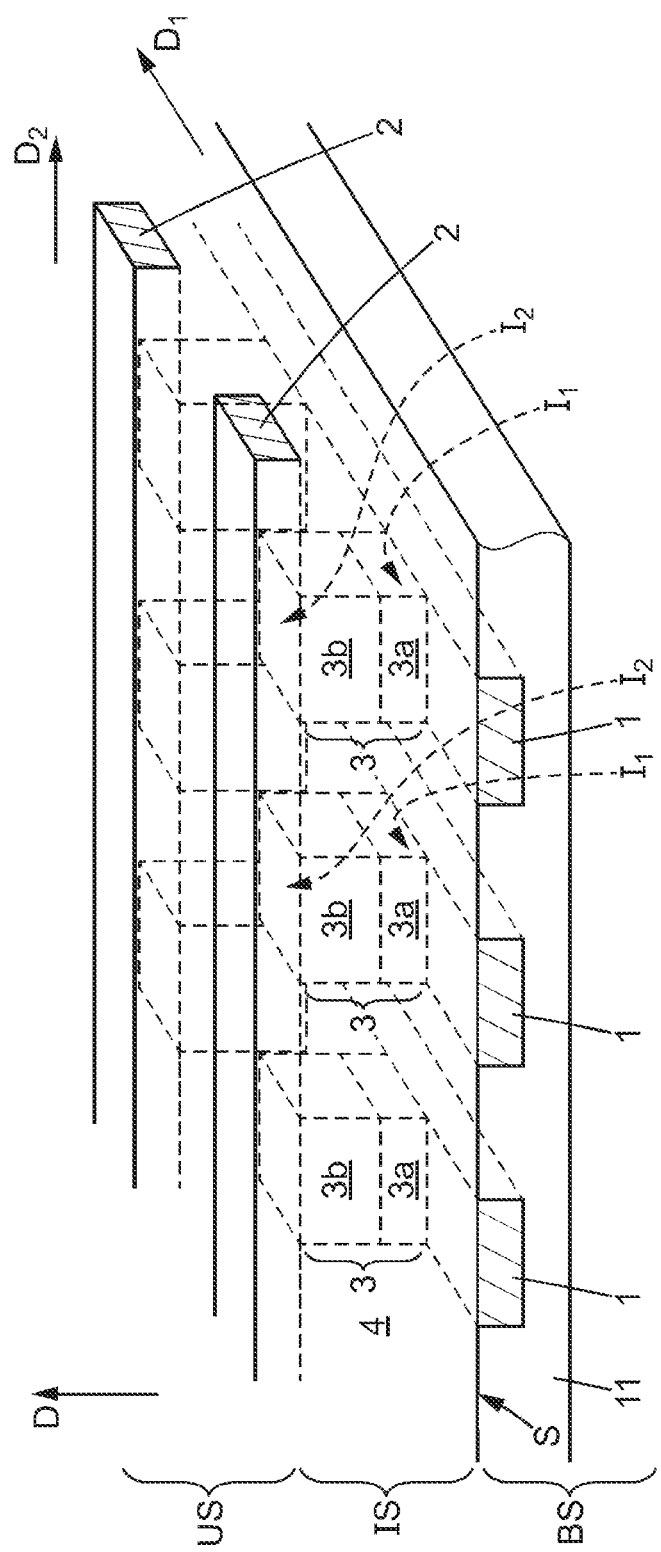

SWITCHING DEVICE WITH ACTIVE PORTION CONFIGURED TO SWITCH BETWEEN INSULATING STATE AND CONDUCTING STATE

CROSS-REFERENCE TO RELATED APPLICATIONS

This application claims foreign priority to European Patent Application No. EP 18173009.4, filed on May 17, 2018, the content of which is incorporated by reference herein in its entirety.

BACKGROUND

Field

The disclosed technology generally relates to a switching device and more particularly to a switching device based on an active portion capable of switching from an insulating state to a conductive state.

Description of the Related Technology

Electronic devices capable of controlled switching are useful for many applications, including selection arrays for random access memories. For various applications, desirable attributes for such switching devices include low threshold switching voltage, low leakage current, short response (e.g., switching) time and high reliability, among other attributes. Other desirable attributes can be related to circuit manufacturing, including, e.g., simple designs of the switching device, compatibility with integrated circuit fabrication processes and low manufacturing cost, among other attributes.

For addressing some of these issues, U.S. Pat. No. 6,967,344 proposes multi-terminal electronic switching devices which are based each on a portion of a chalcogenide material. A chalcogenide material may include elements such as sulfur, selenium and tellurium, which may be combined with many metal elements for forming materials that are capable of switching between an electrically insulating state and an electrically conducting state. Some of these materials may be referred to as Ovonic materials, which have been described in, e.g., the article entitled "Analytical model for subthreshold conduction and threshold switching in chalcogenide-based memory devices", by D. Ielmini et al., Journal of Applied Physics 102, 054517 (2007). For example, one such Ovonic material includes $Ge_2Sb_2Te_5$. When initially in the insulating state, an Ovonic material portion switches to the conducting state when a voltage which is applied to the portion becomes higher than a threshold value. An Ovonic threshold voltage of some Ovonic materials may be, e.g., between 1.2 V (volt) and 2.2 V for a thicknesses ranging between 8 nm (nanometer) and 32 nm. However, such threshold voltage values may be high with respect to the voltage values that are commonly available in some integrated circuits, and special control design is therefore necessary for triggering the switching of such ovonic material portion. In particular, document U.S. Pat. No. 6,967,344 implements a switching device design which comprises top and bottom electrodes arranged on opposing sides of an ovonic material portion, but also an additional control electrode which is useful for producing within the portion a voltage distribution which is suitable for causing transition from an insulating state to a conducting state. However, such three-electrode design for the switching device may employ a relatively complicated manufacturing process and may be operated using a relatively complicated control mode.

Thus, one object of certain embodiments or the disclosed technology is to provide new electronic switching devices that are relatively simple to manufacture and can be operated using a relatively simple control mode.

Another object of certain embodiments of the disclosed technology is to provide such electronic switching devices that can be manufactured using processes that are compatible with existing manufacturing processes for integrated electronic circuits, and can be operated at voltages that are compatible with voltage values that are commonly available in existing integrated circuits.

SUMMARY OF CERTAIN INVENTIVE ASPECTS

For meeting at least one of these objects or others, a first aspect of the disclosed technology proposes a switching device which comprises: at least two electrodes which are arranged apart from each other; an active portion which is intermediate between both electrodes and in electrical contact with each electrode, the active portion being selected so that it is capable of switching from an electrically insulating state to an electrically conducting state when a voltage which is higher than a threshold value is applied between both electrodes, wherein an electrical resistance of the active portion existing between both electrodes is lower for the conducting state compared to the insulating state; and a passive portion which is electrically insulating and arranged adjacent to the active portion.

According to the disclosed technology, a material composition of at least one among the active portion and the passive portion varies between two points of at least one path from one of the electrodes to the other electrode. Such variation in the material composition is selected so that a relative dielectric permittivity is non-uniform along the path, and creates an electric field concentration at at least one location within the active portion when in the insulating state and a non-zero voltage is applied between both electrodes. Put another way, the electric field is higher at the concentration location than at another location also within the active portion.

Because the variation in the dielectric permittivity concentrates the electric field at one location within the active portion, the voltage threshold which is effective for causing the active portion to switch from insulating state to conducting state is not too high. Thus, switching of the active portion can be obtained through simple two-electrode control mode, without a third control electrode being necessary. To promote the electric field concentration effect, the variation of the relative dielectric permittivity between two points of the path is preferably higher than 6, more preferably higher than 10, most preferably higher than 20.

Thanks to the two-electrode control mode, the design of the switching device according to various embodiments can be simple, and is compatible with low-cost manufacturing processes.

In addition, the design of the switching device according to various embodiments provides a trade-off between limited voltage to be applied between the electrodes but sufficient for producing the switching operation, and low leakage current through the active portion when in the insulating state.

In certain embodiments, the material of the active portion may be an ovonic material. In particular, using an ovonic material for the active portion allows obtaining low leakage current in the insulating state, short response time and high reliability for the switching device.

Generally, for both electrodes, a respective contact interface between the active portion and one of the electrodes may be perpendicular to a rectilinear direction which extends from one of the electrodes to the other one. For such configuration, the active portion may have side faces which are parallel to the rectilinear direction. This corresponds to the active portion having a pillar shape which extends from one of the electrodes to the other one, with the interfaces between the active portion and the electrodes which are perpendicular to the pillar direction. Then, the passive portion may be located between two planes which contain the contact interfaces and are perpendicular to the rectilinear direction of the pillar, and the passive portion may surround at least partially the active portion laterally.

In some possible first embodiments, the material composition of the active portion varies between both electrodes so that the relative dielectric permittivity is non-uniform within the active portion. In such cases, the above-mentioned path extends through the active portion. Then, respective cross-sections of the active portion and of the electrodes may be identical, each cross-section being perpendicular to the rectilinear direction.

In some possible second embodiments, each electrode may extend perpendicular to the rectilinear direction beyond at least one side face of the active portion. Then, the material composition of the passive portion may vary between respective protrusions of the electrodes that extend laterally beyond the side face of the active portion, so that the relative dielectric permittivity is non-uniform within the passive portion between the electrode protrusions. In such other cases, the above-mentioned path extends through the passive portion. In particular, the passive portion may then be a stack of at least two electrically insulating layers, and the active portion is then arranged through the stack.

In some of the second embodiments, a first one of the layers of the passive portion has a value $\varepsilon_{LK}$ for the relative dielectric permittivity and a thickness $t_{LK}$, and a second one of the layers of the passive portion has a value $\varepsilon_{HK}$ for the relative dielectric permittivity and a thickness $t_{HK}$, and the following inequalities are met: $\varepsilon_{LK}<\varepsilon_{HK}$ and $t_{LK}<t_{HK}$, the thicknesses being measured parallel to the rectilinear direction.

Generally when the active portion has a pillar shape, the switching device may further comprise a metal portion which is arranged adjacent to the active portion, this metal portion having a thickness which is less than a separating distance existing between both electrodes. To this purpose, the thickness of the metal portion and the separating distance are measured parallel to the rectilinear direction. In this way, the metal portion promotes the localized concentration of the electric field within the active portion in a further extent. The metal portion preferably surrounds the active portion laterally. It may also be electrically insulated from each of the electrodes, for example as a floating metal portion or a metal portion which is biased separately from both electrodes of the switching device.

In addition, for some of the second embodiments as recited above, the metal portion may be located between respective portions of both electrically insulating layers of the passive portion.

A second aspect of the disclosed technology further proposes a selection array which comprises: a layer of first electrodes, all first electrodes being formed by respective first conducting tracks that are spaced from each other and parallel to a first direction; a layer of second electrodes, all second electrodes being formed by respective second conducting tracks that are spaced from each other and parallel to a second direction, the layers of the first and second electrodes being both parallel to a base plane and the first and second directions crossing each other in projection on the base plane; active portions which are arranged between the layer of the first electrodes and the layer of the second electrodes, so that each active portion bridges one of the first electrodes and one of the second electrodes with respective electrical contact interfaces; and passive material which is located between neighboring ones of the active portions.

In such selection array, each active portion forms a switching device according to the first aspect, with respective portions of one of the first electrodes and one of the second electrodes, and at least one portion of the passive material which is adjacent to the active portion. In particular, the array may form a random access memory selection array.

Finally, a third aspect of the disclosed technology further proposes a method of manufacturing at least one switching device, which comprises one of the first and second step sequences recited below.

The first step sequence comprises:

/1/ obtaining a base structure having a planar surface and comprising at least one first electrode which is flush with the planar surface;

/2/ forming a layer of an active material on the planar surface of the base structure, the active material being selected for being capable of switching from an electrically insulating state to an electrically conducting state when a voltage which is higher than a threshold value is applied between two opposed surfaces of this layer of active material;

/3/ removing the layer of the active material selectively outside an area which is located above the first electrode, so that a portion of the active material, called active portion, remains on said first electrode;

/4/ deposition of a dielectric material on the base structure, so that the active portion is embedded within the dielectric material;

/5/ polishing the dielectric material so that the active portion is flush with a planar abrasion surface of the dielectric material on a side opposed to the base structure; and /6/ forming the second electrode on the active portion on the side opposed to the base structure.

The second step sequence comprises:

/1'/ obtaining a base structure having a planar surface and comprising at least one first electrode which is flush with the planar surface;

/2'/ deposition of a dielectric material layer on the planar surface of the base structure;

/3'/ removing the dielectric material selectively inside an area which is comprised in a cross-section of the first electrode parallel to the planar surface of the base structure, so as to form a cavity which extends to the first electrode;

/4'/ filling the cavity with an active material selected for being capable of switching from an electrically insulating state to an electrically conducting state when a voltage which is higher than a threshold value is applied between two opposed surfaces of a portion of the active material;

/5'/ polishing the active material so that the dielectric material layer is flush with a planar abrasion surface on a side opposed to the base structure, the cavity filled with the active material forming an active portion; and /6'/ forming the second electrode on the active portion on the side opposed to the base structure.

When the method is to produce at least one switching device in accordance with one of the first embodiments that have been mentioned for the first aspect, the active material is varied in composition during step /2/ or /4'/, so that a relative dielectric permittivity of this active material is non-uniform along a direction perpendicular to the planar surface of the base structure.

Alternatively, when the method is to produce at least one switching device in accordance with one of the second embodiments, the dielectric material is varied in composition during step /4/ or /2'/, so that a relative dielectric permittivity of this dielectric material is non-uniform along the direction perpendicular to the planar surface of the base structure.

Possibly, both implementations may be combined, so that the active material and the dielectric material both vary in composition along the direction perpendicular to the planar surface of the base structure. In this way, an increased concentration of the electric field may be obtained within the active portion.

These and other features of the invention will be now described with reference to the appended figures, which relate to preferred but not-limiting embodiments of the invention.

BRIEF DESCRIPTION OF THE DRAWINGS

FIG. 3a is a perspective view a selection array including switching devices which are in accordance with the first embodiment illustrated in FIG. 1.

FIG. 3b is a perspective view a selection array including switching devices which are in accordance with the second embodiment illustrated in FIG. 2a.

Figure 1:
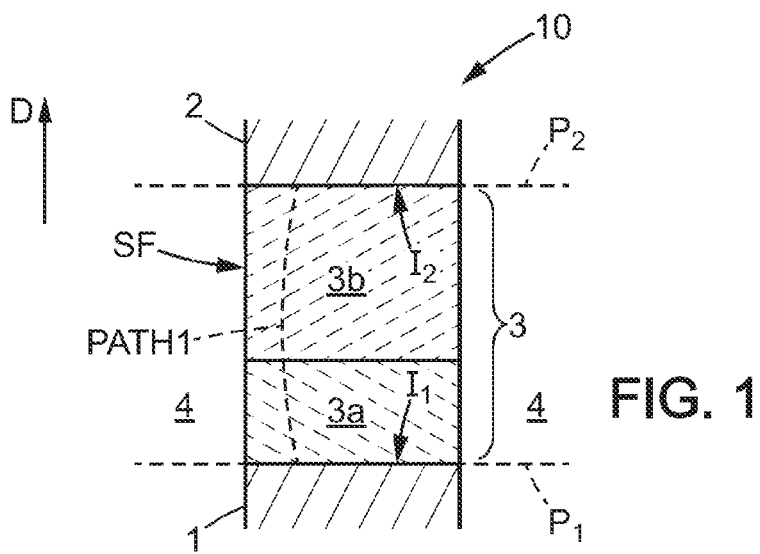
FIG. 1 is a cross-sectional view of a switching device according to a first embodiment of the disclosed technology.

For clarity sake, element sizes which appear in these figures may not correspond to actual dimensions or dimension ratios. Also, same reference numbers which are indicated in different ones of these figures denote identical or corresponding elements or elements with identical or corresponding function.

DETAILED DESCRIPTION OF CERTAIN ILLUSTRATIVE EMBODIMENTS

In the figures, reference number 10 generally denotes a switching device as provided by the disclosed technology. For illustration purposes without limitation, each of the switching devices described herein comprises an active portion 3 comprising an Ovonic material. Such Ovonic material is capable of switching from an electrically insulating state to an electrically conducting state when a voltage which is applied to the active portion 3 reaches or exceeds a threshold value. Thus, the switching devices 10 are of the type that may be referred to as an Ovonic threshold switch.

For example, at least part of the active portion 3 may have one of the material compositions $Ge_2Sb_2Te_5$ and $GeS_x$.

Each switching device 10 comprises a first electrode 1, the active portion 3 and a second electrode 2 which are superposed along a rectilinear direction D. $P_1$ denotes a plane which is superposed to an interface $I_1$ existing between the electrode 1 and the active portion 3, and $P_2$ denotes another plane which is superposed to an interface $I_2$ existing between the electrode 2 and the active portion 3. In some designs for the switching devices 10, the planes $P_1$ and $P_2$ may be parallel and spaced by a distance equal to a thickness of the active portion 3. The electrodes 1 and 2 may be comprised of a suitable conductive material such as, e.g., copper or a copper-based alloy. Possibly, a suitable electrically conducting interface layer (not represented) may be arranged between the active portion 3 and each one of the electrodes 1 and 2.

Each switching device 10 further comprises a dielectric material portion 4 which is adjacent to the active portion 3 and formed adjacent to one or more side faces (SFs) of the active portion 3. Such dielectric material portion 4 may be referred to herein as a passive portion in the general part of the description. In some embodiments, the passive portion 4 surrounds laterally the active portion 3 between the planes $P_1$ and $P_2$.

In the embodiment represented in FIG. 1, respective cross-sections of the active portion 3 and of the electrodes 1 and 2 may be identical, perpendicular to the direction D. Put another way, each of the electrodes 1 and 2 has respective lateral edges which are aligned with the side faces SFs of the active portion 3. The active portion 3 has a material composition which varies along the direction D. For example, a lower part 3a of the active portion 3 may have a first composition, e.g., a chalcogenide composition such as a first Ovonic composition such as $Ge_2Sb_2Te_5$, with a first relative dielectric permittivity value of about 12, whereas an upper part 3b of the active portion 3 may have a second composition different from the first composition, e.g., a chalcogenide composition such as a second Ovonic composition such as $GeS_x$ with a second relative dielectric permittivity value different from the first relative dielectric permittivity value of about 20. Such difference in the dielectric permittivity value between the lower and upper parts 3a and 3b, together with a boundary between the parts 3a and 3b which is perpendicular to the direction D, is such that a voltage applied between the electrodes 1 and 2 forms a steeper gradient in one of the parts 3a and 3b which has a lower permittivity value. So, the electric field is higher in the part of the active portion 3 having the lower permittivity value, when compared to the electric field in the other part of the active portion 3 having a higher permittivity value. In accordance with the general part of this description, the electric field is said to be concentrated at a location within the part 3a of the active portion 3. Since the transition from insulating state to conducting state of the ovonic material is triggered by the electric field reaching a critical field value, the distribution of the active portion 3 into two parts having dielectric permittivity values which are different allows reaching the critical field value first within the part 3a, for a voltage value applied between the electrodes 1 and 2 which may be lower compared to the a corresponding voltage value for a configuration in which the material of the part 3a constitutes the whole active portion 3 with identical total thickness. A further optimized design of the switching device 10 is obtained when the ovonic material of the part 3a has not only a dielectric permittivity value which is lower than that of the ovonic material of the part 3b, but also has a critical field value which is lower than the critical field value of the ovonic material of the part 3b. Once the part 3a of ovonic material has switched to conducting state, it triggers immediately the part 3b to switch in turn to conducting state, because the electric field has then become concentrated within the part 3b only. For example, the part 3a of the active portion 3 may be 20 nm in thickness along the direction D, and the part 3b may be 25 nm-thick.

For connection with the general part of the description of the disclosed technology, PATH1 extends through the active portion parts 3a and 3b from the electrode 1 to the electrode 2. The variation in the ovonic material at the boundary between both parts 3a and 3b produces the variation in the dielectric permittivity value at one location on PATH1.

Figure 2A:
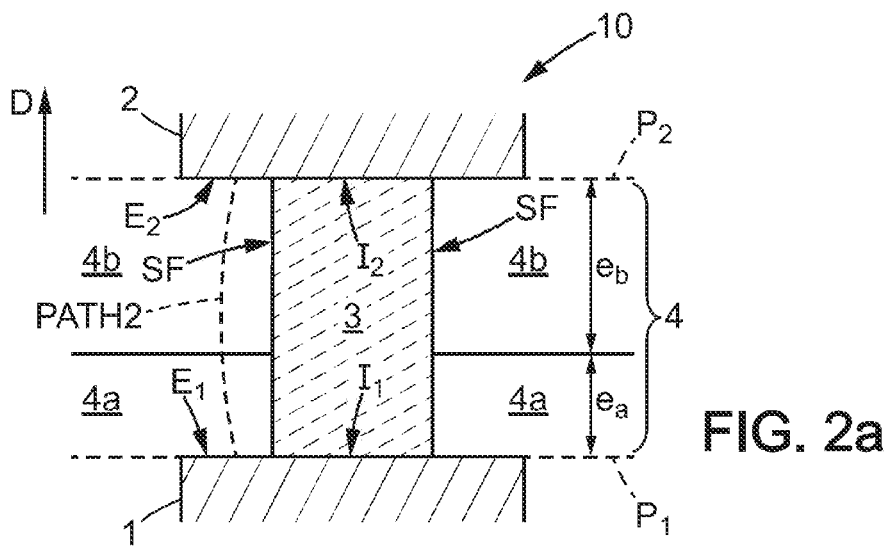
FIGS. 2a and 2b are cross-sectional views of two switching devices according to a second embodiment of the disclosed technology.

In the embodiment represented in FIG. 2a, the electrodes 1 and 2 have lateral dimensions in a direction perpendicular to the direction D that are greater than those of the active portion 3. Then, $E_1$ denotes a lateral protrusion of the electrode 1, which extends beyond the side face SF of the active portion 3. $E_2$ has the same meaning for the electrode 2. In some configurations, such lateral protrusions of the electrodes 1 and 2 are identical and may exist all around the active portion 3. In addition, the active portion 3 may have a uniform material composition, for example $GeS_x$. Then, the passive portion 4 extends to the side faces SF of the active portion 3 between the electrode protrusions $E_1$ and $E_2$. In such embodiment, the passive portion 4 is comprised of at least two layers 4a and 4b which are superposed along the direction D, and which have respective dielectric permittivity values that are different. For example, the layer 4a may be a first dielectric layer, e.g., a silica ($SiO_2$) layer, with a first relative dielectric permittivity value $\varepsilon_{LK}$, which may, e.g., be about 3.9, and the layer 4b may be a second dielectric layer different from the first dielectric layer, e.g., a hafnium oxide ($HfO_2$) layer, with second relative dielectric permittivity value $\varepsilon_{HK}$, which may, e.g., be about 25. Such variation in the dielectric permittivity value within the passive portion 4 causes the electric field to be higher in one of the layers 4a and 4b which has the lower permittivity value, between the electrode protrusions $E_1$ and $E_2$, when compared to the electric field in the other of the layers 4a and 4b. Then, the electric field in the active portion 3 is concentrated at a location within this active portion which is close to the layer of the passive portion 4 which has the lowest dielectric permittivity value. This is due to continuity of the component of the electric field which is parallel to the side face SF, between the passive portion 4 and the active portion 3. Thus, a concentration effect for the electric field also exists for such second embodiment, although the material of the active portion 3 is uniform. For increasing such concentration effect, the thickness along the direction D of that one of the layers 4a and 4b which has the lowest dielectric permittivity value is preferably smaller than the thickness of the other layer. For example, the $SiO_2$-layer 3a may be 10 nm in thickness, and the $HfO_2$-layer 3b may be 20 nm in thickness. The thickness $e_a$ of the layer 4a indicated in FIG. 2a corresponds to $e_{LK}$ as mentioned in the general part of the description, and the thickness eb of the layer 4b corresponds to $e_{HK}$.

For connection with the general part of the description of the disclosed technology, PATH2 extends through the layers 4a and 4b from the lateral protrusion $E_1$ of the electrode 1 to the lateral protrusion $E_2$ of the electrode 2. The variation in the dielectric material at the boundary between both layers 4a and 4b produces the variation in the dielectric permittivity value at one location on PATH2.

Figure 2B:
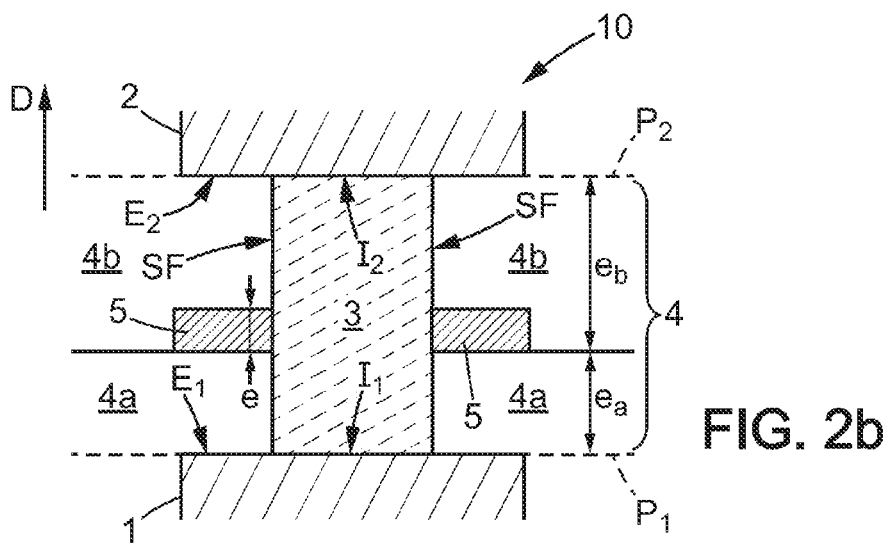

The embodiment of FIG. 2b corresponds to that of FIG. 2a, except that a metal portion 5 has been added adjacent to the boundary between the layers 4a and 4b, and also adjacent to the active portion 3. The metal portion 5 may have a thickness e of about 5 nm, when measured parallel to the direction D. In some configurations, the metal portion 5 surrounds the active portion 3 laterally as a ring, by forming a complete loop perpendicular to the direction D. Because the electric field is low or almost zero within the metal portion 3, and the component of the electric field which is parallel to the side face SF is continuous between the metal portion 5 and the active portion 3, the metal portion 5 causes the electric field to be more concentrated at one location within the active portion 3. This lowers in a further extent the voltage value to be applied between both electrodes 1 and 2 for producing the critical field value of the ovonic material at the electric field concentration location within the active portion 3. The metal portion 5 may be either a floating metal portion, e.g., electrically isolated from any electrode of a circuit which comprises the switching device 10, or a biased metal portion, e.g., connected electrically to an electrode of the circuit, including possibly connected to one of the electrodes 1 and 2 of the switching device 10.

The improvement of the disclosed technology which includes adding the metal portion 5 may also be combined with the embodiment of FIG. 1, in a way similar to that described with reference to FIG. 2b.

FIG. 3a illustrates a selection array which is based on the disclosed embodiment of FIG. 1. Such selection array has a cross-point configuration, and is suitable for forming a random access memory selection array. Combination of such cross-point selection array with a matrix of random access memory elements is well known, so that it is not described here.

As represented in FIG. 3a, a plurality of line electrodes 1 are arranged parallel to a common direction D1 at a planar surface S of an insulating substrate 11. The planar surface S has been called base plane in the general part of this description. The line electrodes 1 are preferably regularly spaced, and separated from each other by intermediate regions of the substrate 11. The substrate 11 and the line electrodes 1 form a base structure BS of the selection array. An intermediate structure IS which comprises the active portions 3 surrounded by dielectric material is arranged on top of the base structure BS. The active portions 3 extend from the planar surface S to the opposed surface of the intermediate structure IS. For each active portion 3, a respective part of the dielectric material which is adjacent to this active portion 3 forms the corresponding passive portion 4 as mentioned above in this description. Finally, an upper structure US is arranged on top of the intermediate structure IS, which comprises a plurality line electrodes 2. The line electrodes 2 are parallel to a common direction $D_2$, preferably regularly spaced and separated from each other by intermediate insulating regions of the upper structure US. The line electrodes 2 may also be oriented perpendicular to the line electrodes 1, as this appears in projection on the planar surface S. The line electrodes 2 are in electrical contact with the active portions 3, so that each active portion 3 connects electrically one of the line electrodes 1 with one of the line electrodes 2, according to a matrix arrangement which provides a respective connection between any one of the line electrodes 1 and any one of the line electrodes 2.

According to the disclosed technology, the active portions 3 are each comprised of at least two parts 3a and 3b, which are superposed along the direction D and different in dielectric permittivity value.

Figure 3B:
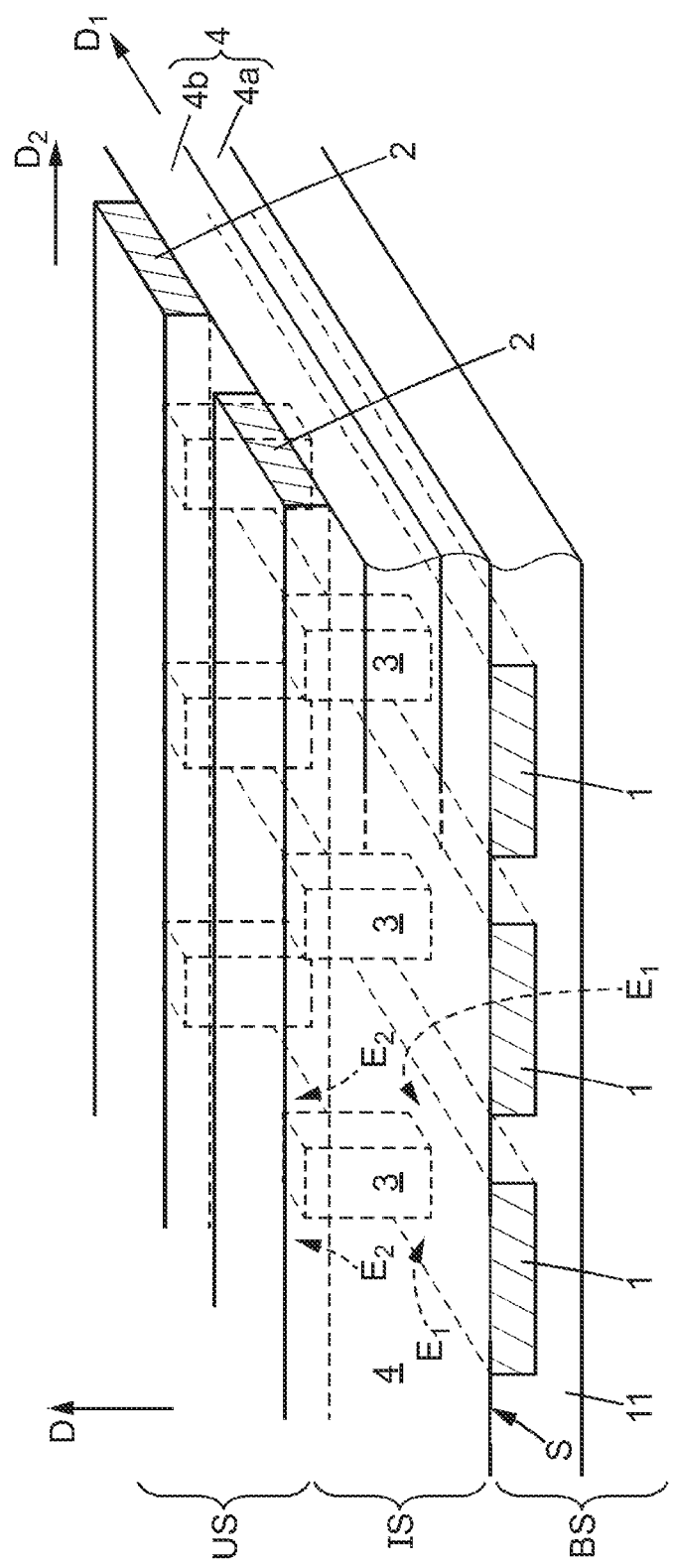

Other selection arrays may be designed similarly but based on the disclosed embodiments of FIG. 2a or 2b. In such other selection arrays, the line electrodes 1 and 2 are each larger in width that the active portions 3. In this way, lateral rim portions of the line electrodes 1 and 2 and the continuous extension of these line electrodes between the active portions 3 form the lateral protrusions $E_1$ and $E_2$ as represented in FIG. 2a at 2b. FIG. 3b shows such a selection array in which the switching devices correspond individually to FIG. 2a.

Two manufacturing step sequences are now described with reference to FIGS. 4a-4f and 5a-5f, respectively, which are each suitable for producing selection arrays as shown in FIGS. 3a and 3b. These manufacturing sequences implement damascene processes, including masking, material deposition and polishing steps which are supposed to be well-known, so that only the step sequences are recited below without describing each step in detail.

Figure 4A:
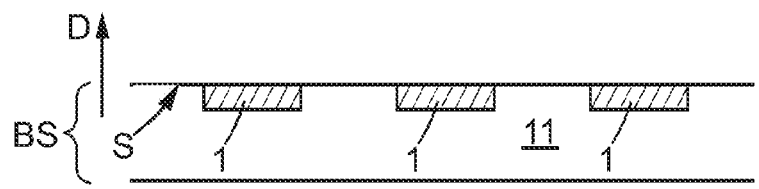
FIGS. 4a-4f are cross-sectional views which illustrate steps of a first method suitable for manufacturing switching devices according to the disclosed technology.
Figure 5A:
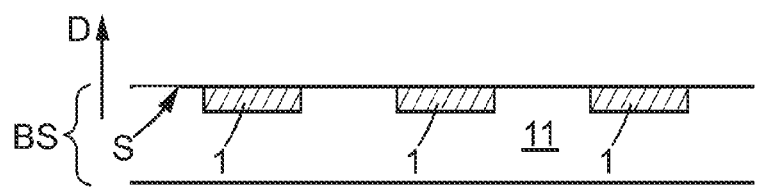
FIGS. 5a-5f are cross-sectional views which illustrate steps of a second method suitable for manufacturing switching devices according to the disclosed technology.

FIGS. 4a and 5a, which are identical, show the base structure BS which constitutes the initial configuration of a selection array being manufactured. In this the base structure BS, the line electrodes 1 are uncovered. They may be copper-based and the insulating material 11 may be silica supported by any substrate (not shown).

Figure 4B:
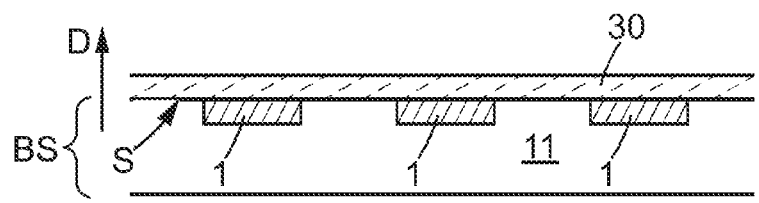
Figure 4C:
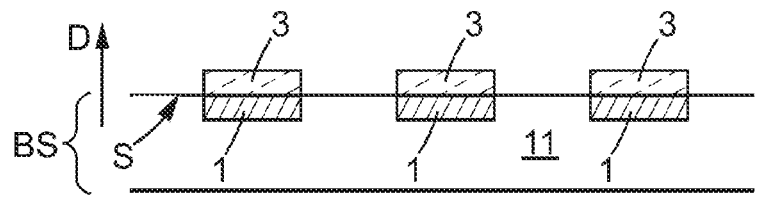
Figure 4D:
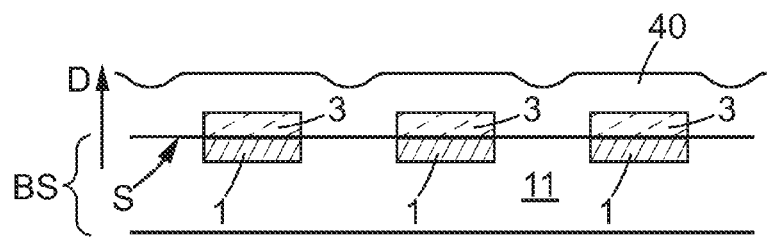

According to FIG. 4b, an active material layer 30, e.g., an Ovonic material layer in the embodiments considered, is deposited on the planar surface S of the base structure BS. If the selection array is to be comprised of switching devices 10 which have each a configuration as shown in FIG. 1, the layer 30 is comprised of a first sublayer which is deposited at first, for example a first layer of Ovonic material such as $Ge_2Sb_2Te_5$, followed by a second sublayer, for example a second layer of Ovonic material such as $GeSe_x$. The second sublayer is deposited preferably shortly or immediately after the first one and on top of it for avoiding that pollutes be present at the interface between both sublayers of ovonic materials. Alternatively, if the selection array is to be comprised of switching devices 10 which have each a configuration as shown in FIG. 2a, the layer 30 may be uniform, for example comprised of $GeSe_x$ only.

Then, the layer 30 is etched (FIG. 4c) selectively so that portions thereof only remain above selected areas of the line electrodes 1. These remaining portions of the layer 30 form the active portions 3 of the selection array.

A layer of dielectric material 40 (FIG. 4d) is then deposited above the base structure BS and the active portions 3, so as to completely fill spaces existing between neighboring ones of the active portions 3. To this end, a thickness of the layer of dielectric material 40 along the direction D may be greater than that of the active portions 3. If the selection array is to be comprised of switching devices 10 which have each a configuration as shown in FIG. 1, the layer of dielectric material 40 may be uniform, for example comprised of silica only. Alternatively, if the selection array is to be comprised of switching devices 10 which have each a configuration as shown in FIG. 2a, the layer of dielectric material 40 is comprised of a first sublayer which is deposited at first, for example a layer of silica, followed by a second sublayer, for example a layer of hafnium oxide.

Figure 4E:
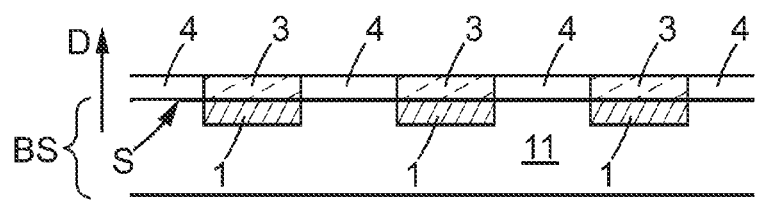

The layer of dielectric material 40 is then polished so as to recover a planar upper surface and expose the active portions 3 (FIG. 4e). The layer of dielectric material 40 thus constitutes the passive portions 4 which surround the active portions 3. At this stage, the base structure BS is provided with the intermediate structure IS.

Finally, the selection array is completed by forming the upper structure US. A first part of a layer of insulating material 21 is deposited on top of the intermediate structure IS, and etched selectively at the locations of the line electrodes 2. A conducting material, for example copper, may be deposited into the cavities etched for forming the line electrodes 2. Then, the layer of insulating material 21 may be completed so that the line electrodes 2 are embedded within the upper structure US.

The step sequence of FIGS. 5a-5f differs from that of FIGS. 4a-4f in that the dielectric material 40 is deposited before the ovonic material.

Figure 5B:
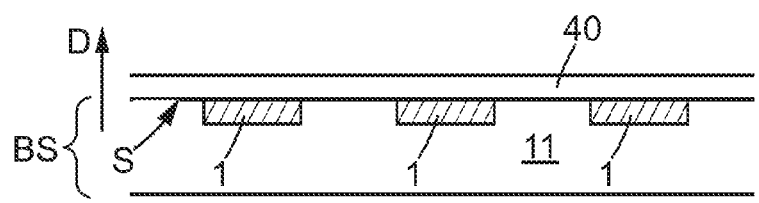
Figure 5C:
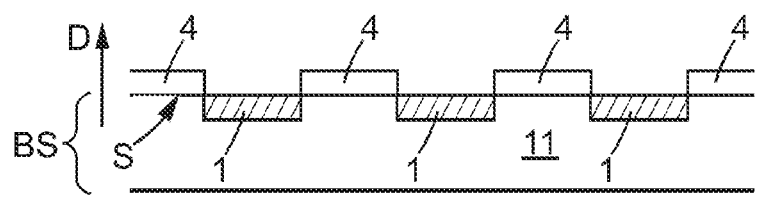
Figure 5D:
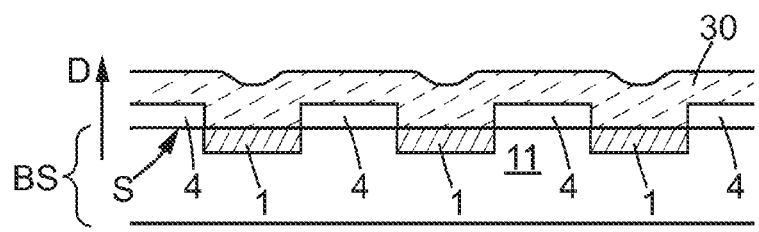

According to FIG. 5b, a dielectric material layer 40 is deposited on the planar surface S of the base structure BS. If the selection array is to be comprised of switching devices 10 which have each a configuration as shown in FIG. 1, this layer is uniform in composition, such as a silica layer. Alternatively, for switching devices 10 as shown in FIG. 2a, the layer of dielectric material 40 is comprised of a first sublayer which is deposited at first, for example a layer of silica, followed by a second sublayer, for example a layer of hafnium oxide.

Then, the layer of dielectric material 40 is etched (FIG. 5c) selectively at locations where the active portions 3 are to be formed. These locations are situated above parts of the line electrodes 1, and the selective etching of the layer of dielectric material 40 is continued until the line electrodes 1 become uncovered at the bottom of the etching cavities. The remaining part of the layer of dielectric material 40 forms the passive portions 4 of the selection array.

A layer of active material 30 (FIG. 5d) is then deposited above the base structure BS and the passive portions 4, so as to completely fill the cavities previously etched in the dielectric material layer 40. To this end, a thickness of the layer of active material 30 along the direction D is higher than that of the passive portions 4. If the selection array is to be comprised of switching devices 10 which have each a configuration as shown in FIG. 1, the layer of active material 30 is comprised of a first sublayer which is deposited at first, for example a layer of the ovonic material $Ge_2Sb_2Te_5$, followed by a second sublayer, for example a layer of the ovonic material $GeSe_x$. Alternatively, if the selection array is to be comprised of switching devices 10 which have each a configuration as shown in FIG. 2a, the layer 30 may be uniform, for example comprised of $GeSe_x$ only.

Figure 5E:
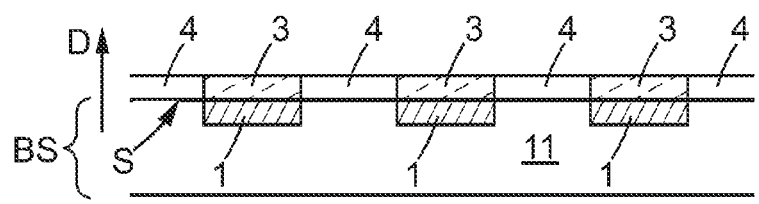
Figure 5F:
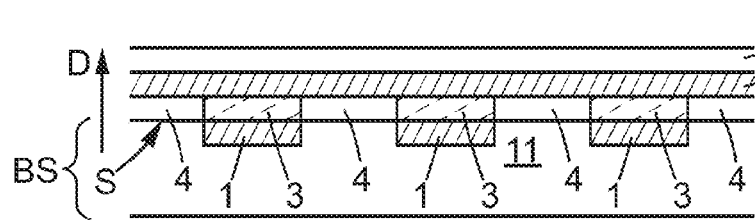

The layer of active material 30 is then polished so as to recover a planar upper surface and expose the passive portions 4 (FIG. 5e). After completion of the polishing step, the active portions 3 remain and are separated by the surrounding passive portions 4, thus forming the intermediate structure IS.

Figure 4F:
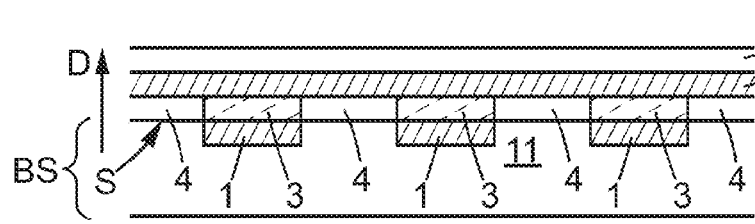

The upper structure US is then formed (FIG. 5f), possibly as described with reference to FIG. 4f.

Although it does not appear in FIGS. 4a-4f and 5a-5f, when switching devices 10 according to the embodiment of FIG. 2a are to be manufactured, the lateral dimensions of the active portions 3 and the width of each line electrode 1 or 2 are to be modified so that each active portion is smaller in width than each line electrode.

A person of ordinary skill in the art will be capable of adapting these step sequences for manufacturing a selection array in which the switching devices 10 are in accordance with FIG. 2b, e.g., with metal portions 5.

Other adaptations may be introduced while maintaining at least some of the invention advantages which have been mentioned. In particular, the materials cited were only for exemplifying purpose and may be replaced by others.

What is claimed is:

1. A switching device comprising:
   two electrodes arranged apart from each other;
   an active portion interposed between and contacting each of the two electrodes, wherein the active portion is capable of threshold switching from an electrically insulating state to an electrically conducting state when a voltage higher than a threshold value is applied between the two electrodes and returning to the electrically insulating state when the voltage falls below the threshold value, wherein an electrical resistance of the active portion is lower in the conducting state compared to the insulating state; and
   a passive portion which is electrically insulating and arranged adjacent to the active portion,
   wherein a material composition of one or both of the active portion and the passive portion varies between two points of at least one path from one of the two electrodes to the other of the two electrodes, such that a relative dielectric permittivity is non-uniform along the at least one path, thereby creating a concentration of electric field at at least one concentration location within the active portion when in the insulating state and a non-zero voltage is applied between the two electrodes, the electric field being higher at the concentration location than at another location also within the active portion.

2. The switching device of claim 1, wherein a difference of the relative dielectric permittivity between two points of the at least one path is higher than 6.

3. The switching device of claim 1, wherein for the two electrodes, a respective contact interface between the active portion and one of the two electrodes is perpendicular to a rectilinear direction which extends from one of the two electrodes to the other of the two electrodes, and the active portion has side faces which are parallel to the rectilinear direction.

4. The switching device of claim 3, wherein the passive portion is located between two planes which contain the contact interfaces and are perpendicular to the rectilinear direction, and the passive portion at least partially surrounds the active portion laterally.

5. The switching device of claim 3, wherein the material composition of the active portion varies between the two electrodes such that the relative dielectric permittivity is non-uniform within the active portion, and respective cross-sections of the active portion and of the electrodes are identical, the cross-sections being perpendicular to the rectilinear direction.

6. The switching device of claim 3, wherein each of the two electrodes extends perpendicular to the rectilinear direction beyond at least one of the side faces of the active portion, and the material composition of the passive portion varies between respective protrusions of the electrodes that extend laterally beyond the at least one of the side faces of the active portion, such that the relative dielectric permittivity is non-uniform within the passive portion between the protrusions of the electrodes.

7. The switching device of claim 6, wherein the passive portion is a stack of at least two electrically insulating layers and the active portion is arranged through the stack.

8. The switching device of claim 7, wherein a first one of the layers has a value $\varepsilon_{LK}$ for the relative dielectric permittivity and a thickness $t_{LK}$, and a second one of the layers has a value $\varepsilon_{HK}$ for the relative dielectric permittivity and a thickness $t_{HK}$, and the following inequalities are met: $\varepsilon_{LK} < \varepsilon_{HK}$ and $t_{LK} < t_{HK}$, the thicknesses being measured parallel to the rectilinear direction.

9. The switching device of claim 3, further comprising a metal portion arranged adjacent to the active portion, the metal portion having a thickness which is less than a separating distance between the two electrodes, the thickness of the metal portion and the separating distance being measured parallel to the rectilinear direction.

10. The switching device of claim 9, wherein the metal portion laterally surrounds the active portion.

11. The switching device of claim 9, wherein the metal portion is electrically insulated from each of the two electrodes, preferably the metal portion is a floating metal portion.

12. The switching device of claim 7, wherein the metal portion is located between respective portions of the at least two electrically insulating layers of the passive portion.

13. The switching device of claim 1, wherein the active portion comprises a first layer having a first chalcogenide composition and a second layer having a second chalcogenide composition and contacting the first layer.

14. The switching device of claim 13, wherein the first layer is formed of $Ge_2Sb_2Te_5$, and wherein the second layer is formed of $GeSe_x$.

15. A selection array, comprising:
    a layer of first electrodes, the first electrodes being formed by respective first conducting tracks that are spaced from each other and extending parallel in a first direction;
    a layer of second electrodes, the second electrodes being formed by respective second conducting tracks that are spaced from each other and extending parallel in a second direction, the layers of the first and second electrodes being both parallel to a base plane and the first and second directions crossing each other in projection on the base plane;
    active portions arranged between the layer of the first electrodes and the layer of the second electrodes, such that each of the active portions bridges one of the first electrodes and one of the second electrodes with respective electrical contact interfaces; and
    a passive material located between neighboring ones of the active portions,
    wherein each of the active portions forms the active portion of the switching device according to claim 1, with respective portions of one of the first electrodes and one of the second electrodes, and at least one portion of the passive material which is adjacent to the active portion.

16. The selection array according to claim 15 that is configured as a random access memory selection array.

17. A method of manufacturing at least one switching device, comprising one of a first step sequence and a second step sequence, the method comprising:
    the first step sequence comprising:
    (1) obtaining a base structure having a planar surface and comprising a first electrode which is flush with the planar surface,
    (2) forming a layer of an active material on the planar surface of the base structure, the active material being capable of switching from an electrically insulating state to an electrically conducting state when a voltage higher than a threshold value is applied between two opposing surfaces of the layer of the active material,
    (3) removing the layer of the active material selectively outside an area which is located above the first electrode, such that a portion of the active material remains on the first electrode, (4) depositing a dielectric material on the base structure, such that the portion of the active material is embedded within the dielectric material, (5) polishing the dielectric material such that the portion of the active material is flush with a planar abrasion surface of the dielectric material on a side opposite to the base structure, and (6) forming a second electrode on the portion of the active material on the side opposite to the base structure; and the second step sequence comprising:

(1') obtaining a base structure having a planar surface and comprising a first electrode which is flush with the planar surface, (2') depositing a layer of dielectric material on the planar surface of the base structure, (3') removing the layer of dielectric material selectively inside an area which is comprised in a cross-section of the first electrode parallel to the planar surface of the base structure, so as to form a cavity which extends to the first electrode, (4') filling the cavity with an active material capable of switching from an electrically insulating state to an electrically conducting state when a voltage higher than a threshold value is applied between two opposing surfaces of a portion of the active material, (5') polishing the active material such that the layer of the dielectric material is flush with a planar abrasion surface on a side opposite to the base structure, the cavity filled with the active material forming an active portion, and (6') forming a second electrode on the active portion on the side opposite to the base structure, wherein the active material is varied in composition during step (2) or step (4'), such that a relative dielectric permittivity is non-uniform along a direction perpendicular to the planar surface of the base structure, or the dielectric material is varied in composition during step (4) or step (2'), such that a relative dielectric permittivity of the dielectric material is non-uniform along the direction perpendicular to the planar surface of the base structure.

* * * * *